United States Patent [19]
Kakura et al.

[11] Patent Number: 5,917,372
[45] Date of Patent: Jun. 29, 1999

[54] AUTOMATIC GAIN CONTROL CIRCUIT

[75] Inventors: Yoshikazu Kakura; Tomoki Osawa, both of Tokyo, Japan

[73] Assignee: NEC Corporation, Tokyo, Japan

[21] Appl. No.: 08/914,068

[22] Filed: Aug. 18, 1997

[30]     Foreign Application Priority Data

Aug. 23, 1996  [JP]  Japan .................................... 8-221966

[51] Int. Cl.$^6$ .............................. H03G 3/20; H03G 3/10; H04B 1/06
[52] U.S. Cl. ........................ 330/129; 330/279; 455/234.1
[58] Field of Search ................... 330/129, 279, 330/284; 455/246.1, 249.1, 250.1, 234.1

[56]           References Cited

U.S. PATENT DOCUMENTS 5,369,789  11/1994  Kosugi et al. ........................... 330/129
5,737,033   4/1998  Masuda .................................... 330/129

FOREIGN PATENT DOCUMENTS 55-97714  7/1980  Japan .

*Primary Examiner*—Robert Pascal
*Assistant Examiner*—Patricia T. Nguyen
*Attorney, Agent, or Firm*—Scully, Scott, Murphy & Presser

[57]                ABSTRACT

An automatic gain control circuit comprising a variable gain amplifier for controlling a gain of an input signal in accordance with a gain control signal, and outputting the controlled signal, a demodulator for demodulating an output signal from said variable gain amplifier and outputting a baseband signal, an amplitude detecting circuit for detecting an amplitude of the baseband signal to output an amplitude signal, a target amplitude generating circuit for outputting a target amplitude signal, a subtracter for outputting an amplitude error signal based on a difference between the amplitude signal and the target amplitude signal, a sequence control circuit for outputting trigger signals corresponding to not less than a given one-bit interval, and a gain setting circuit for setting a gain with a precision corresponding to a width of $(1/N)^M$ by repeatedly performing, over M steps, an operation of selecting and setting one of N gains in steps of 1/N of a total gain width in accordance with the N trigger signals on the basis of the amplitude error signal.

5 Claims, 7 Drawing Sheets

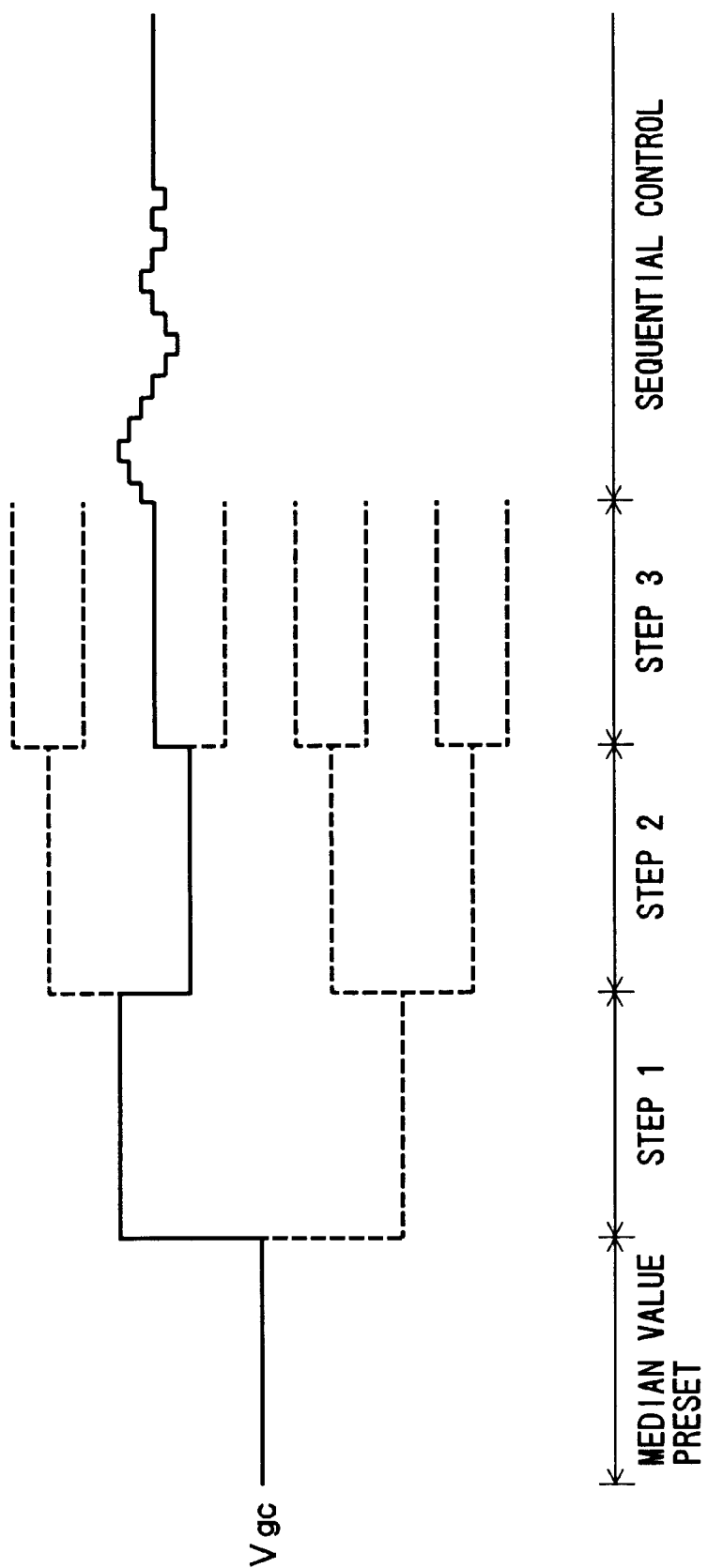

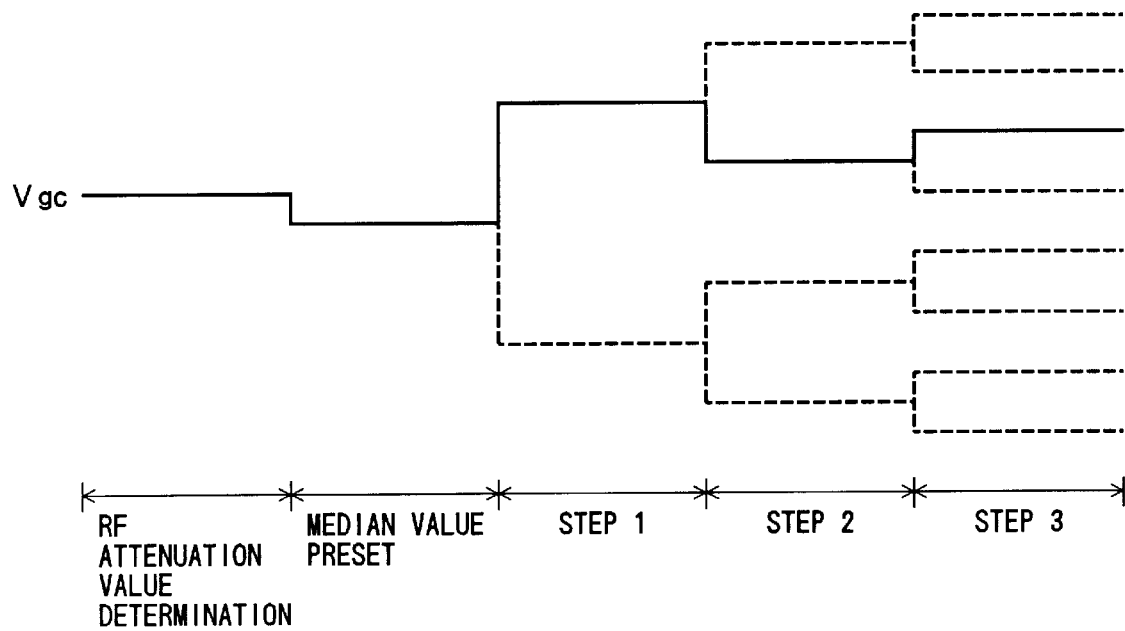

AUTOMATIC GAIN CONTROL CIRCUIT

BACKGROUND OF THE INVENTION

1. Field of the Invention

The present invention relates to an automatic gain control circuit for automatically controlling the gain of an amplifier in accordance with an input signal and supplying a stable amplifier output.

2. Description of the Prior Art

A conventional automatic gain control circuit performs coarse gain control by analog gain control, and fine gain control by digital gain control.

The hybrid automatic gain control circuit disclosed in Japanese Unexamined Patent Publication No. 55-97714 will be described below with reference to FIG. 1. A gain selector 401 coarsely controls the gain of a register input signal $S_{in}$ in accordance with an output signal $S_{RO1}$ from a register 402 to output an analog gain control output signal $S_{agco}$. The register 402 stores a gain control signal $S_{C1}$ and outputs the register output signal $S_{RO1}$. An A/D converter 404 converts the analog gain control output signal $S_{agco}$ into a digital signal and outputs it as an A/D output signal $S_{ado}$. A register 406 stores a gain control signal $S_{C2}$ and finely controls the gain of a multiplier 405 in accordance with a register output signal $S_{RO2}$ to output a digital gain control output signal $S_{dgco}$. A gain control circuit 403 receives the digital gain control output signal $S_{dgco}$ from the multiplier 405, and outputs the gain control signal $S_{C1}$ for coarse gain control and the gain control signal $S_{C2}$ for fine gain control. In this manner, automatic gain control is performed to keep the input signal to the demodulation circuit constant.

Owing to the above circuit arrangement of the conventional automatic gain control circuit, as the loop gain increases, an error increases, whereas as the loop gain decreases, the control processing speed decreases. To realize high-speed and stable control, the loop gain must be controlled. In addition, the circuit constituted by the analog gain control section for coarse gain control and the digital gain control section for fine gain control becomes complicated.

SUMMARY OF THE INVENTION

The present invention has been made in consideration of the above situation in the prior art, and has as its object to provide an automatic gain control circuit which can realize high-speed and stable gain control in a wide dynamic range with the simplest circuit arrangement.

In order to achieve the above object, according to the first aspect of the present invention, there is provided an automatic gain control circuit comprising a variable gain amplifier for controlling a gain of an input signal in accordance with a gain control signal, and outputting the controlled signal, a demodulator for demodulating an output signal from the variable gain amplifier and outputting a baseband signal, an amplitude detecting circuit for detecting an amplitude of the baseband signal to output an amplitude signal, a target amplitude generating circuit for outputting a target amplitude signal, a subtracter for outputting an amplitude error signal based on a difference between the amplitude signal and the target amplitude signal, a sequence control circuit for outputting trigger signals corresponding to not less than a given one-bit interval, and a gain setting circuit for setting a gain with a precision corresponding to a width of $(1/N)^M$ by repeatedly performing an operation of selecting and setting one of N gains in steps of 1/N of a total gain width in accordance with the N trigger signals on the basis of the amplitude error signal over M steps.

According to the second aspect of the present invention, there is provided an automatic gain control circuit comprising a variable gain amplifier for controlling a gain of an input signal in accordance with a gain control signal, and outputting the controlled signal, a demodulator for demodulating an output signal from the variable gain amplifier and outputting a baseband signal, an amplitude detecting circuit for detecting an amplitude of the baseband signal to output an amplitude signal, a target amplitude generating circuit for outputting a target amplitude signal, a subtracter for outputting an amplitude error signal by calculating a difference between the amplitude signal and the target amplitude signal, a sequence control circuit for outputting trigger signals corresponding to not less than a given one-bit interval, and a gain setting circuit for setting a gain with a precision corresponding to a width of $(1/N)^M$ by repeatedly performing, over M steps, an operation of selecting and setting one of N gains in steps of 1/N of a total gain width in accordance with the N trigger signals on the basis of the amplitude error signal after an insensitive portion corresponding to a predetermined period of time.

According to the third aspect of the present invention, there is provided an automatic gain control circuit comprising a variable gain amplifier for controlling a gain of an input signal in accordance with a gain control signal, and outputting the controlled signal, a demodulator for demodulating the IF signal to output a baseband signal, an amplitude detecting circuit for detecting an amplitude of the baseband signal to output an amplitude signal, a target amplitude generating circuit for outputting a target amplitude signal, a subtracter for outputting an amplitude error signal based on a difference between the amplitude signal and the target amplitude signal, a sequence control circuit for outputting trigger signals corresponding to not less than a given one-bit interval, and a gain setting circuit for setting a gain with a precision corresponding to a width of $(1/N)^M$ by repeatedly performing, over M steps, an operation of selecting and setting one of N gains in steps of 1/N of a total gain width in accordance with the N trigger signals on the basis of the amplitude error signal, and then performing gain control sequentially and continuously by using a primary loop.

According to the fourth aspect of the present invention, there is provided an automatic gain control circuit comprising an RF attenuator control circuit for receiving the amplitude error signal and the trigger signals and outputting an RF attenuation control signal, a RF attenuator for outputting an attenuated signal upon changing an attenuation ratio of an RF signal in accordance with the attenuation control signal, an oscillator for outputting a down conversion signal, and a mixer for down-converting the attenuated signal into an IF signal in accordance with the down conversion signal, a variable gain amplifier for controlling a gain of an IF signal in accordance with a gain control signal, and outputting a demodulator input signal, a demodulator for demodulating the demodulator input signal and outputting a baseband signal, an amplitude detecting circuit for detecting an amplitude of the baseband signal to output an amplitude signal, a target amplitude generating circuit for outputting a target amplitude signal, a subtracter for outputting an amplitude error signal by calculating a difference between the amplitude signal and the target amplitude signal, a sequence control circuit for outputting trigger signals corresponding to not less than a given one-bit interval, and a gain setting circuit for setting a gain with a precision corresponding to a width of $(1/N)^M$ by repeatedly performing, over M steps, an operation of selecting and setting one of N gains in steps of 1/N of a total gain width in accordance with the N trigger signals on the basis of the amplitude error signal.

In the first to fourth aspects, N and M can be variable.

According to the function of the present invention, high-speed, stable control can be realized by repeatedly performing an operation of selecting and setting one of the gains in steps of 1/N of the total gain width on the basis of an amplitude error signal.

The following effects can be obtained by the present invention. According to the first aspect, a high-seed, stable automatic gain control circuit can be realized with a simple circuit arrangement. In addition, by setting an insensitive portion before integration is started by the counter, the influences of the transient response of the variable gain amplifier on level determination can be eliminated. According to the second aspect, a high-speed digital automatic gain control circuit with little jitter can be realized. According to the third aspect, an automatic gain control circuit exhibiting a wide dynamic range with respect to RF signals can be realized.

The above and many other objects, features and advantages of the present invention will become manifest to those skilled in the art upon making reference to the following detailed description and accompanying drawings in which preferred embodiments incorporated the principles of the present invention are shown by way of illustrative example.

BRIEF DESCRIPTION OF THE DRAWINGS

FIG. 6 is a graph showing changes in gain control voltage in the second embodiment of the present invention; and FIG. 7 is a graph showing changes in gain control voltage in the third embodiment of the present invention.

DETAILED DESCRIPTION OF THE PREFERRED EMBODIMENTS

Several preferred embodiments of the present invention will be described below with reference to the accompanying drawings.

Figure 1:
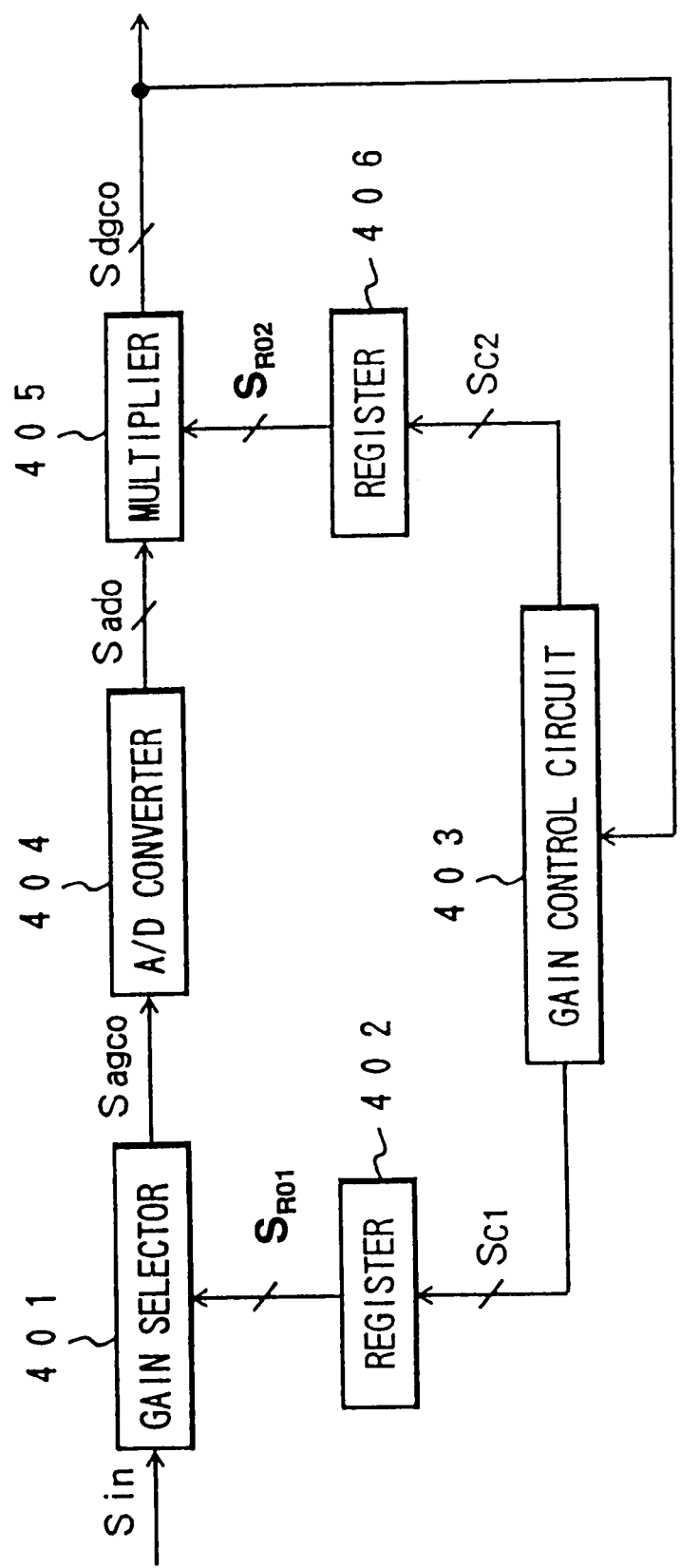
FIG. 1 is a block diagram showing an example of the arrangement of a conventional automatic gain control circuit.
Figure 2:
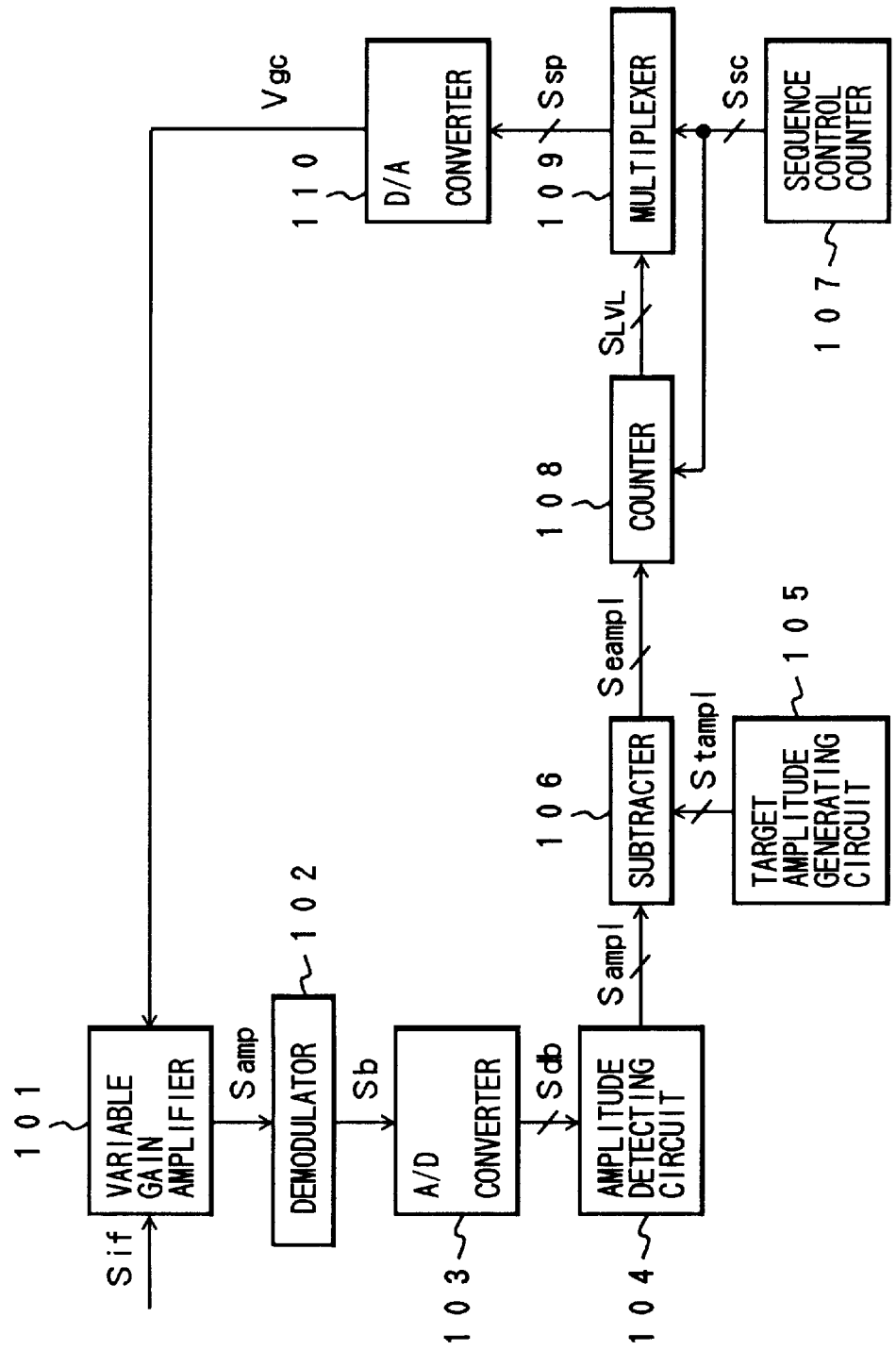
FIG. 2 is a block diagram showing an automatic gain control circuit according to the first embodiment of the present invention.

FIG. 2 is a block diagram showing an automatic gain control circuit according to the first embodiment of the present invention. A variable gain amplifier 101 controls the gain of an IF signal $S_{if}$ by using a gain control voltage $V_{gc}$, and outputs an amplifier output signal $S_{amp}$. A demodulator 102 demodulates the amplifier output signal $S_{amp}$ to output a baseband signal $S_b$. An A/D converter 103 converts the baseband signal $S_b$ into a digital value and outputs it as a digital baseband signal $S_{db}$. An amplitude detecting circuit 104 obtains the amplitude of the digital baseband signal $S_d$ to output an amplitude signal $S_{ampl}$. A target amplitude generating circuit 105 outputs a target amplitude signal $S_{tampl}$, as the target value of the amplitude signal $S_{ampl}$. A subtracter 106 subtracts the target amplitude signal $S_{tampl}$ from the amplitude signal $S_{ampl}$ to output an amplitude error signal $S_{eampl}$.

A sequence control counter 107 outputs a sequence control signal $S_{SC}$ for controlling a gain control sequence on the basis of a step count M. A counter 108 integrates the amplitude error signal $S_{eampl}$ for a predetermined period of time in accordance with the sequence control signal $S_{SC}$ to determine the level of the amplitude signal $S_{ampl}$ with respect to the target amplitude signal $S_{tampl}$, and outputs a level determination signal $S_{LVL}$. A multiplexer 109 selects and sets one of N (predetermined value) gains set in steps of 1/N of the total gain width in accordance with the level determination signal $S_{LVL}$, and outputs a step preset signal $S_{SP}$. The multiplexer 109 performs this operation the number of times corresponding to the step count M set by the sequence control counter 107. The D/A converter 110 converts the step preset signal $S_{SP}$ into an analog value and outputs it as the gain control voltage $V_{gc}$. With the above operation, high-speed digital automatic gain control that converges exponentially can be realized.

Figure 5:
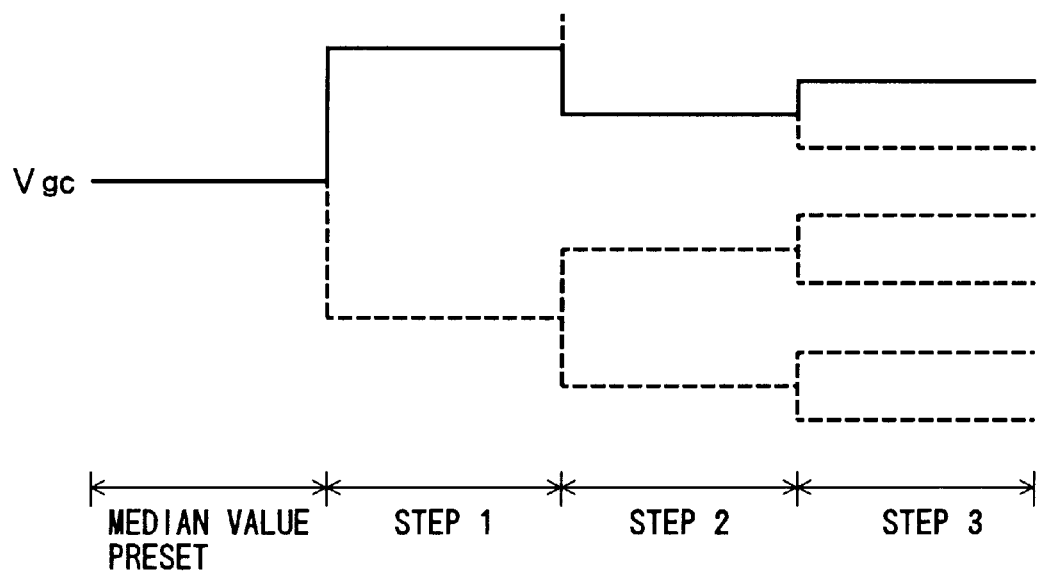
FIG. 5 is a graph showing changes in gain control voltage in the first embodiment of the present invention.

If, for example, the above operation is performed for N=2 and M=3, the level determination signal $S_{LVL}$ takes only two values, i.e., High and Low levels. When control is started in accordance with the sequence control signal $S_{SC}$, the step preset signal $S_{SP}$ is preset to set the gain control voltage $V_{gc}$ to the overall median value, as shown in FIG. 5.

The counter 108 integrates the amplitude error signal $S_{eampl}$ for a predetermined period of time. If the amplitude signal $S_{ampl}$ is larger than the target amplitude signal $S_{tampl}$, the level determination signal $S_{LVL}$ is set at High level. Otherwise, the level determination signal $S_{LVL}$ is set to Low level. When the level determination signal $S_{LVL}$ is set at High level, the present value in step 1 is preset to the median value between the overall median value and the maximum value, as indicated by the solid line in FIG. 5. When the level determination signal $S_{LVL}$ is set at Low level, the preset value is set to the median value between the overall median value and the minimum value, as indicated by the dotted line in FIG. 5. Similarly, in step 2, the preset value is preset in a width of $(½)^2$, as indicated by the solid line in FIG. 5, when the level determination signal $S_{LVL}$ is set at High level in step 1, and at Low level in step 2. In step 3, the preset value is preset in a width of $(½)^3$, as indicated by the solid line, when the level determination signal $S_{LVL}$ is set at High level. In this case, therefore, the value of the gain control voltage $V_{gc}$ converges exponentially with a precision corresponding to a width of $(½)^3$.

In this embodiment, when the counter 108 integrates the amplitude error signal $S_{eampl}$, a level determination error may occur due to the transient response of the variable gain amplifier 101. If an insensitive portion is set by the sequence control signal $S_{SC}$ before the integrating operation of the counter 108, and a portion, of the amplitude error signal $S_{eampl}$, which corresponds to the insensitive portion is not used for integration, the influence of the transient response of the variable gain amplifier 101 on level determination can be eliminated.

Figure 3:
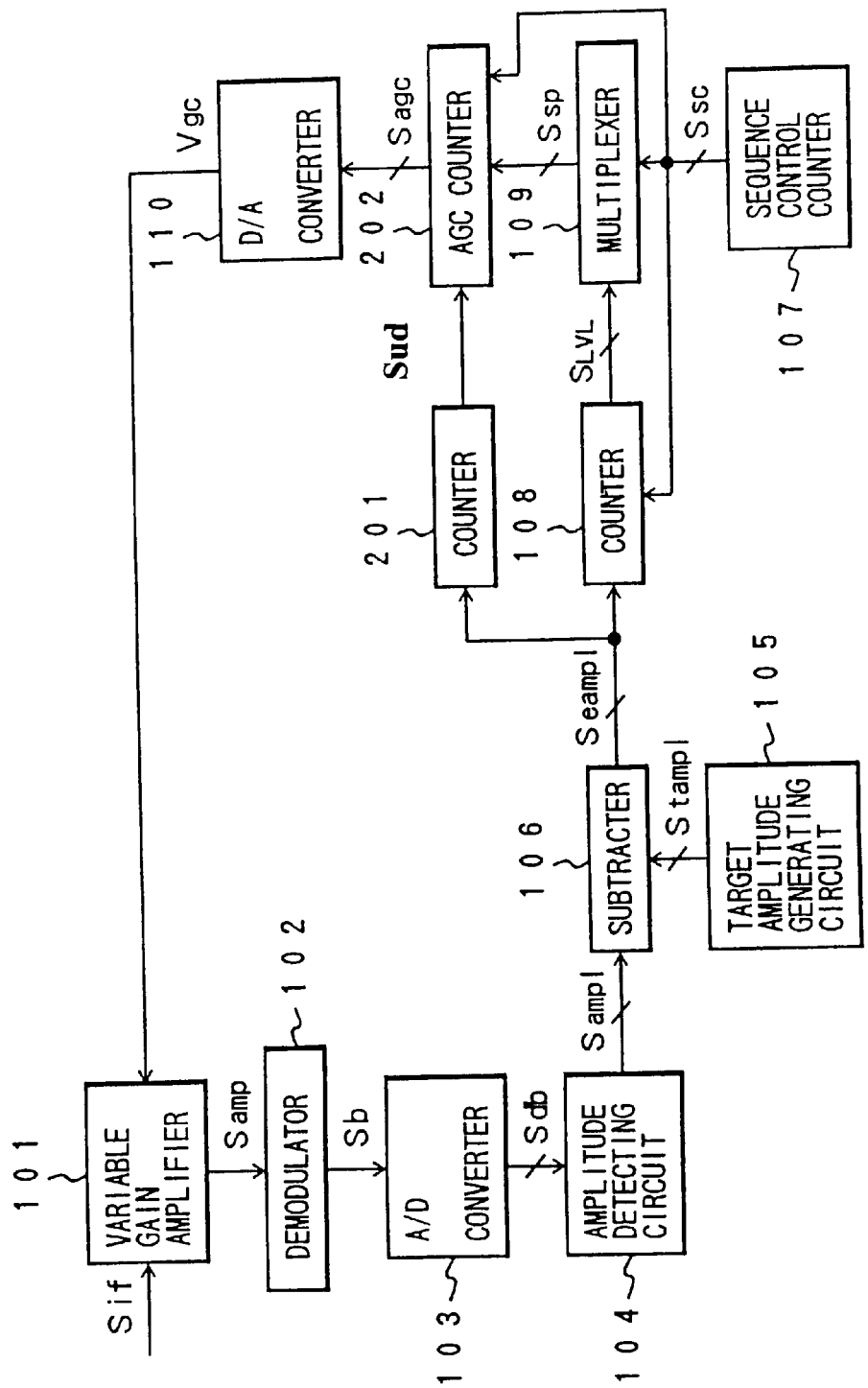
FIG. 3 is a block diagram showing an automatic gain control circuit according to the second embodiment of the present invention.

FIG. 3 is a block diagram showing an automatic gain control circuit according to the second embodiment of the present invention. The same reference numerals in FIG. 3 denote the same parts as in FIG. 2.

A variable gain amplifier 101 controls the gain of an IF signal $S_{if}$ by using a gain control voltage $V_{gc}$, and outputs an amplifier output signal $S_{amp}$. A demodulator 102 demodulates the amplifier output signal $S_{amp}$ to output a baseband signal $S_b$. An A/D converter 103 converts the baseband signal $S_b$ into a digital value and outputs it as a digital baseband signal $S_{db}$. An amplitude detecting circuit 104 obtains the amplitude of the digital baseband signal $S_{db}$ to output an amplitude signal $S_{ampl}$. A target amplitude generating circuit 105 outputs a target amplitude signal $S_{tampl}$ as the target value of the amplitude signal $S_{ampl}$. A subtracter 106 subtracts the target amplitude signal $S_{tampl}$ from the amplitude signal $S_{ampl}$ to output an amplitude error signal $S_{eampl}$. A sequence control counter 107 outputs a sequence control signal $S_{SC}$ for controlling a gain control sequence on the basis of a step count M. A counter 108 integrates the amplitude error signal $S_{eampl}$ for a predetermined period of time in accordance with the sequence control signal $S_{SC}$ to determine the level of the amplitude signal $S_{ampl}$ with respect to the target amplitude signal $S_{tampl}$, and outputs a level determination signal $S_{LVL}$. A multiplexer 109 selects and sets one of N (predetermined value) gains set in steps of 1/N of the total gain width in accordance with the level determination signal $S_{LVL}$, and outputs a step preset signal $S_{SP}$. The multiplexer 109 performs this operation the number of times corresponding to the step count M set by the sequence control counter 107. The above circuit arrangement and operation are the same as those in the first embodiment shown in FIG. 2.

The second embodiment differs from the first embodiment in the following point.

A counter 201 integrates the amplitude error signal $S_{eampl}$, and sequentially outputs an up/down signal $S_{UD}$ as an up signal when the amplitude error signal $S_{eampl}$ is larger than the target amplitude signal $S_{tampl}$, and as a down signal when the amplitude error signal $S_{eampl}$ is smaller than the target amplitude signal $S_{tampl}$. In the counter load mode, an AGC counter 202 loads the step preset signal $S_{SP}$ and outputs it as a gain control signal $S_{agc}$ in accordance with the sequence control signal $S_{SC}$. In the counter enable mode, the AGC counter 202 sequentially raises/lowers the level of the gain control signal $S_{agc}$ in accordance with the up/down signal $S_{UD}$, and outputs the resultant signals. A D/A converter 110 converts the step preset signal $S_{SP}$ into an analog value and outputs it as the gain control voltage $V_{gc}$. With the above operation, high-speed digital automatic gain control with little jitter can be realized.

Assume that the counter enable mode is set by the sequence control signal $S_{SC}$ upon completion of control with a precision corresponding to a gain width of $(½)^3$ in the first embodiment. In this case, as shown in FIG. 6, the gain control converges with a precision corresponding to a width of $(½)^3$ at the end of step 3. At this time, the current operation is switched to the primary loop gain operation with a low loop gain, in which a gain control signal $S_{gc}$ is sequentially controlled in accordance with the up/down signal $S_{UD}$. Since gain control with a high loop gain has proceeded to a precision of $(½)^3$ in advance, the gain control converges in a short period of time. In addition, owing to the control with a low loop gain, the gain control converges to a stable value with little jitter, as shown in FIG. 6.

In the first and second embodiments, the step count M set by the sequence control counter 107 and the gain width division count N set by the multiplexer 109 may be kept constant when the environments where radio waves propagate are constant. If, however, the radio communication environments change, the above values are preferably changed as needed by externally inputting parameters.

Figure 4:
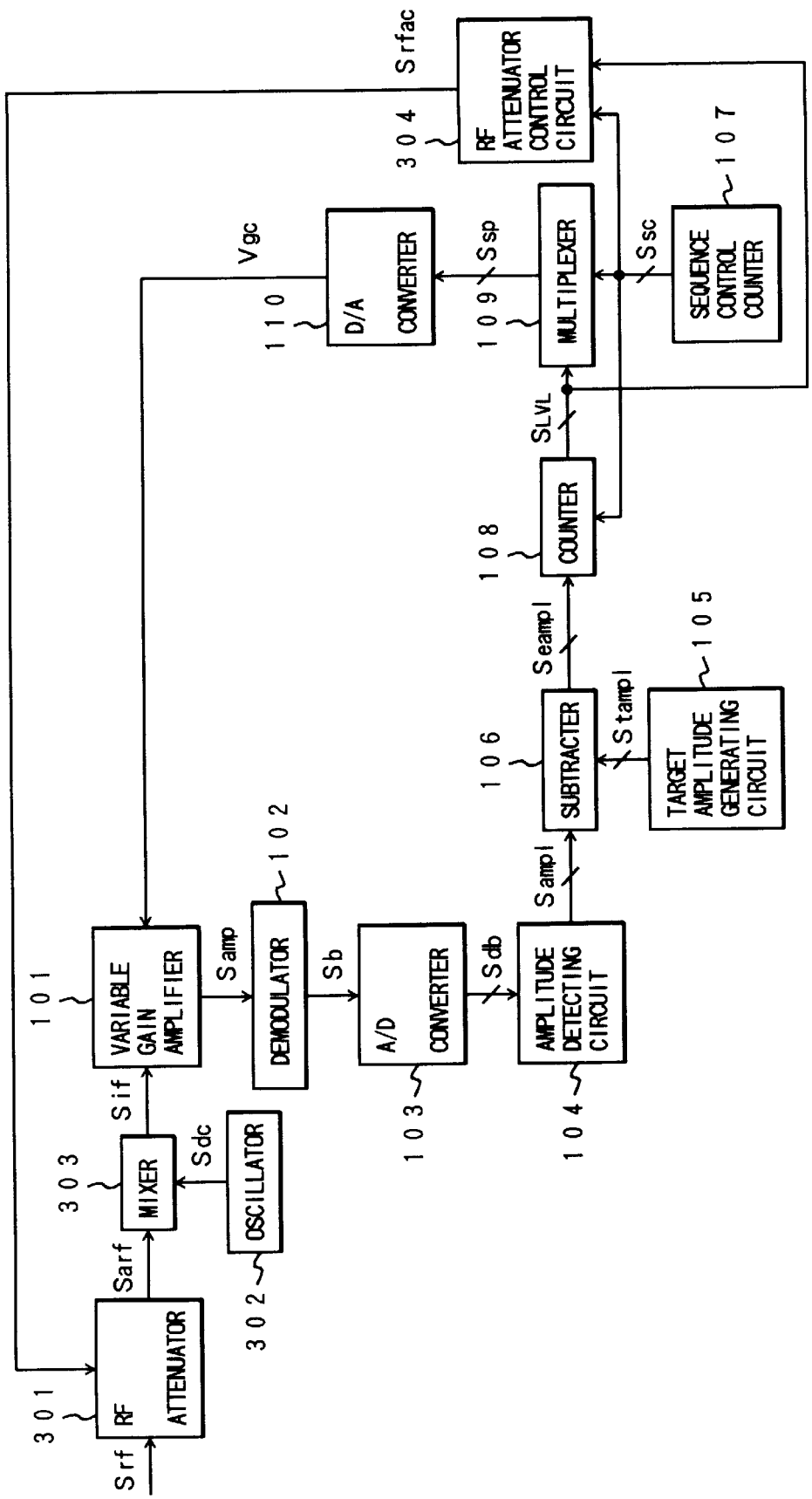
FIG. 4 is a block diagram showing an automatic gain control circuit according to the third embodiment of the present invention.

FIG. 4 is a block diagram showing an automatic gain control circuit according to the third embodiment of the present invention. The same reference numerals in FIG. 4 denote the same parts in FIG. 3.

An RF attenuator 301 attenuates an RF signal $S_{rf}$ in accordance with an RF attenuator control signal $S_{rfac}$ to output an attenuated RF signal $S_{arf}$. A mixer 303 down-converts the attenuated RF signal $S_{arf}$ in accordance with a down conversion signal $S_{dc}$ from an oscillator 302, and outputs the resultant signal as an IF signal $S_{if}$. A variable gain amplifier 101 controls the gain of an IF signal $S_{if}$ by using a gain control voltage $V_{gc}$, and outputs an amplifier output signal $S_{amp}$. A demodulator 102 demodulates the amplifier output signal $S_{amp}$ to output a baseband signal $S_b$. An A/D converter 103 converts the baseband signal $S_b$ into a digital value and outputs it as a digital baseband signal $S_{db}$. An amplitude detecting circuit 104 obtains the amplitude of the digital baseband signal $S_{db}$ to output an amplitude signal $S_{ampl}$. A target amplitude generating circuit 105 outputs a target amplitude signal $S_{tampl}$ as the target value of the amplitude signal $S_{ampl}$. A subtracter 106 subtracts the target amplitude signal $S_{tampl}$ from the amplitude signal $S_{ampl}$ to output an amplitude error signal $S_{eampl}$. A sequence control counter 107 outputs a sequence control signal $S_{SC}$ for controlling a gain control sequence. A counter 108 integrates the amplitude error signal $S_{eampl}$ for a predetermined period of time in accordance with the sequence control signal $S_{SC}$ to determine the level of the amplitude signal $S_{ampl}$ with respect to the target amplitude signal $S_{tampl}$, and outputs a level determination signal $S_{LVL}$. A multiplexer 109 selects and sets one of N gains set in steps of 1/N of the total gain width in accordance with the level determination signal $S_{LVL}$, and outputs a step preset signal $S_{SP}$. The multiplexer 109 performs this operation over M steps. An RF attenuator control circuit 304 outputs the RF attenuator control signal $S_{rfac}$ corresponding to the value of the level determination signal $S_{LVL}$ in accordance with the sequence control signal $S_{SC}$.

Assume that the attenuating operation of the RF attenuator 301 is either ON or OFF. When control is started in accordance with the sequence control signal $S_{SC}$, the gain control voltage $V_{gc}$ is preset for ON/OFF determination for the RF attenuator 301. The counter 108 integrates the amplitude error signal $S_{eampl}$ for a predetermined period of time. If the amplitude signal $S_{ampl}$ is larger than the target amplitude signal $S_{tampl}$, the level determination signal $S_{LVL}$ is set at High level. Otherwise, the level determination signal $S_{LVL}$ is set at Low level. When the level determination signal $S_{LVL}$ is set at High level, the RF attenuator 301 is turned on to attenuate the RF signal $S_{rf}$ and output the attenuated signal. When the level determination signal $S_{LVL}$ is set at Low level, the RF attenuator 301 is turned off to output the RF signal $S_{rf}$ without attenuating it. Thereafter, as shown in FIG. 7, in steps 1, 2, 3, . . . , control is performed in the same manner as the control with the precision corresponding to a gain width of $(½)^3$ in the first embodiment. If ON/OFF control of the RF attenuator is performed at the start of the automatic gain control sequence in this manner, the upper input limit of the RF signal $S_{rf}$ increases by the degree to which attenuation is performed by the RF attenuator. The dynamic range of automatic gain control can therefore be widened.

In this embodiment as well, the gain width division count N set by the multiplexer 109 and the step count M set by the sequence control counter 107 are preferably changed in accordance with radio communication environments.

In the first and second embodiments of the present invention, an IF signal is taken as an example of the input signal subjected to gain control. If, however, the oscillator 302 and the mixer 303, used in the third embodiment, are not connected as shown in FIG. 4, but are connected between the variable gain amplifier 101 and the demodulator 102 in the circuit of FIG. 4, the present invention can be applied to an RF signal.

What is claimed is:

1. An automatic gain control circuit comprising a variable gain amplifier for controlling a gain of an input signal in accordance with a gain control signal, and outputting a controlled signal, a demodulator for demodulating an output signal from said variable gain amplifier and outputting a baseband signal, an amplitude detecting circuit for detecting an amplitude of the baseband signal to output an amplitude signal, a target amplitude generating circuit for outputting a target amplitude signal, a subtracter for outputting an amplitude error signal based on a difference between the amplitude signal and the target amplitude signal, a sequence control circuit for outputting trigger signals corresponding to not less than a given one-bit interval, and a gain setting circuit for setting a gain with a precision corresponding to a width of $(1/N)^M$ by repeatedly performing, over M steps, an operation of selecting and setting one of N gains in steps of 1/N of a total gain width in accordance with the N trigger signals on the basis of the amplitude error signal.

2. A circuit according to claim 1, wherein said gain setting circuit has an insensitive portion corresponding to a predetermined period of time with respect to the amplitude error signal.

3. A circuit according to claim 1, wherein in said gain setting circuit, after a gain with a precision corresponding to a width of $(1/N)^M$ is set by repeatedly performing, over M steps, an operation of selecting and setting one of the N gains in steps of 1/N of the total gain width in accordance with the trigger signals on the basis of the amplitude error signal, gain control is sequentially and continuously performed by a primary loop.

4. A circuit according to claim 1, further comprising an RF attenuator control circuit for receiving the amplitude error signal and the trigger signals and outputting an RF attenuation control signal, a RF attenuator for outputting an attenuated signal upon changing an attenuation ratio of an RF signal in accordance with the attenuation control signal, and a mixer for down-converting the attenuated signal into an IF signal in accordance with the down conversion signal, an oscillator for outputting a down conversion signal, and wherein after the gain control signal is preset by said gain setting circuit in accordance with the trigger signals, and the attenuation ratio of said RF attenuator is controlled, said gain setting circuit sets a gain with the precision corresponding to a width of $(1/N)^M$ by repeatedly performing, over M steps, an operation of selecting and setting one of the N gains in steps of 1/N of the total gain width in accordance with the trigger signals on the basis of the amplitude error signal.

5. A circuit according to claim 1, wherein N and M are variable.

* * * * *